(12) United States Patent
Luce et al.

(10) Patent No.: US 10,017,383 B2
(45) Date of Patent: *Jul. 10, 2018

(54) METHOD OF MANUFACTURING MEMS SWITCHES WITH REDUCED SWITCHING VOLTAGE

(71) Applicant: INTERNATIONAL BUSINESS MACHINES CORPORATION, Armonk, NY (US)

(72) Inventors: Stephen E. Luce, Underhill, VT (US); Anthony K. Stamper, Williston, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 82 days.

This patent is subject to a terminal disclaimer.

(21) Appl. No.: 14/883,825

(22) Filed: Oct. 15, 2015

(65) Prior Publication Data

US 2016/0035511 A1 Feb. 4, 2016

Related U.S. Application Data

(62) Division of application No. 14/670,671, filed on Mar. 27, 2015, now Pat. No. 9,287,075, which is a division (Continued)

(51) Int. Cl.
*B81C 1/00* (2006.01)
*H01H 59/00* (2006.01)
(Continued)

(52) U.S. Cl.
CPC ........ *B81C 1/00698* (2013.01); *B81C 1/0015* (2013.01); *H01H 11/00* (2013.01);
(Continued)

(58) Field of Classification Search
CPC ........ H01H 49/00; H01H 11/00; H01H 59/00; H01H 59/009; H01H 1/58;
(Continued)

(56) References Cited

U.S. PATENT DOCUMENTS 5,430,421 A 7/1995 Bornand et al.
5,578,976 A 11/1996 Yao
(Continued)

FOREIGN PATENT DOCUMENTS

| JP | 54073508 | 6/1979 |
| JP | 10134683 | 10/1998 |
| JP | 11162309 | 6/1999 |

OTHER PUBLICATIONS

Office Action dated Sep. 26, 2016 in related U.S. Appl. No. 14/883,745 8 pages.

(Continued)

*Primary Examiner* — A. Dexter Tugbang
(74) *Attorney, Agent, or Firm* — Steven Meyers; Andrew M. Calderon; Roberts Mlotkowski Safran Cole & Calderon, P.C.

(57) ABSTRACT

An approach includes a method of fabricating a switch. The approach includes forming a fixed electrode, forming a first cantilevered electrode, forming a second cantilevered electrode aligned vertically over the first fixed electrode, and which has an end that overlaps and is operable to directly contact an end of the first cantilevered electrode upon an application of a voltage to the fixed electrode, and forming a hermetically sealed volume encapsulating the first fixed electrode, the second fixed electrode, the first cantilevered electrode, and the second cantilevered electrode.

10 Claims, 10 Drawing Sheets

Related U.S. Application Data of application No. 13/826,070, filed on Mar. 14, 2013, now Pat. No. 9,019,049, which is a division of application No. 12/107,118, filed on Apr. 22, 2008, now Pat. No. 8,451,077.

(51) Int. Cl.
*H01H 11/00* (2006.01)
*H01H 49/00* (2006.01)
*H01H 1/58* (2006.01)

(52) U.S. Cl.
CPC ............ *H01H 49/00* (2013.01); *H01H 59/00* (2013.01); *H01H 59/0009* (2013.01); *B81C 2201/0132* (2013.01); *B81C 2201/0133* (2013.01); *B81C 2201/0145* (2013.01); *B81C 2201/0154* (2013.01); *B81C 2203/0145* (2013.01); *H01H 1/58* (2013.01); *H01H 2059/0018* (2013.01); *Y10T 29/49105* (2015.01)

(58) Field of Classification Search
CPC .......... H01H 2059/0018; B81C 1/0015; B81C 1/00698; B81C 2203/0145; B81C 2201/0132; B81C 2201/0133; B81C 2201/0145; B81C 2201/0154; Y10T 29/49105
See application file for complete search history.

(56) References Cited

U.S. PATENT DOCUMENTS

| | | | |
|---|---|---|---|
| 6,046,659 A | 4/2000 | Loo et al. | |
| 6,054,745 A | 4/2000 | Nakos et al. | |
| 6,127,744 A | 10/2000 | Streeter et al. | |
| 6,143,997 A | 11/2000 | Feng et al. | |
| 6,276,205 B1 | 8/2001 | McNie et al. | |
| 6,373,007 B1 | 4/2002 | Calcatera et al. | |
| 6,384,353 B1 | 5/2002 | Huang et al. | |
| 6,410,360 B1 | 6/2002 | Steenberge | |
| 6,426,687 B1 | 7/2002 | Osborn | |
| 6,465,280 B1 | 10/2002 | Martin et al. | |
| 6,469,603 B1 | 10/2002 | Ruan et al. | |
| 6,570,750 B1 | 5/2003 | Calcatera et al. | |
| 6,621,390 B2 | 9/2003 | Song et al. | |
| 6,657,324 B1 * | 12/2003 | Marumoto ............. H01H 59/00 29/846 |
| 6,750,742 B2 | 6/2004 | Kang et al. | |
| 6,761,829 B2 | 7/2004 | Harris et al. | |
| 6,768,403 B2 | 7/2004 | Hsu et al. | |
| 6,798,315 B2 | 9/2004 | Schaefer | |
| 6,833,985 B2 | 12/2004 | Fujii et al. | |
| 6,841,839 B2 | 1/2005 | Sridhar et al. | |
| 6,876,047 B2 | 4/2005 | Cunningham et al. | |
| 6,891,454 B1 | 5/2005 | Naito et al. | |
| 6,894,592 B2 | 5/2005 | Shen et al. | |
| 6,917,268 B2 | 7/2005 | Deligianni et al. | |
| 6,977,569 B2 | 12/2005 | Deligianni et al. | |
| 7,042,319 B2 | 5/2006 | Ishiwata et al. | |
| 7,145,213 B1 | 12/2006 | Ebel et al. | |
| 7,215,229 B2 | 5/2007 | Shen et al. | |
| 7,250,838 B2 | 7/2007 | Shen et al. | |
| 7,265,429 B2 | 9/2007 | Wan | |
| 7,280,014 B2 | 10/2007 | Potter | |
| 7,299,538 B2 | 11/2007 | Tactic-Lucic | |
| 7,372,348 B2 | 5/2008 | Xu et al. | |
| 7,463,125 B2 | 12/2008 | Sridhar et al. | |
| 7,477,884 B2 | 1/2009 | Choi et al. | |
| 7,692,519 B2 | 4/2010 | Premerlani et al. | |
| 7,759,591 B2 | 7/2010 | Kim et al. | |
| 8,450,625 B2 | 5/2013 | Fujita | |
| 8,736,404 B2 | 5/2014 | Knipe et al. | |
| 8,791,778 B2 | 7/2014 | Anderson et al. | |
| 9,123,493 B2 | 9/2015 | Rogers | |
| 2002/0131228 A1 | 9/2002 | Potter | |
| 2002/0158746 A1 | 10/2002 | Lamborghini et al. | |
| 2003/0080839 A1 | 5/2003 | Wong | |
| 2003/0122640 A1 | 7/2003 | Deligianni et al. | |
| 2003/0132823 A1 | 7/2003 | Hyman et al. | |
| 2003/0151479 A1 | 8/2003 | Stafford et al. | |
| 2003/0210116 A1 | 11/2003 | Lane et al. | |
| 2003/0222740 A1 | 12/2003 | Ruan et al. | |
| 2004/0113727 A1 | 6/2004 | Kawai | |
| 2004/0207498 A1 | 10/2004 | Hyman et al. | |
| 2005/0007219 A1 | 1/2005 | Ma et al. | |
| 2005/0057329 A1 | 3/2005 | Shen et al. | |
| 2005/0121298 A1 | 6/2005 | Sridhar et al. | |
| 2005/0168306 A1 | 8/2005 | Cohn et al. | |
| 2006/0181379 A1 | 8/2006 | Schwartz et al. | |
| 2007/0040637 A1 | 2/2007 | Yee | |
| 2007/0236307 A1 | 10/2007 | Liu | |

OTHER PUBLICATIONS

Office Action dated Sep. 23, 2016 in related U.S. Appl. No. 14/883,836, 8 pages.
Office Action dated Sep. 23, 2016 in related U.S. Appl. No. 14/883,843, 9 pages.
Notice of Allowance dated Nov. 30, 2015 in related U.S. Appl. No. 14/670,671, 10 pages.
Notice of Allowance dated Jul. 20, 2017 in related U.S. Appl. No. 14/883,745, 19 pp.
Notice of Allowance dated Jul. 10, 2017 in related U.S. Appl. No. 14/883,836, 18 pp.
Notice of Allowance dated Jul. 10, 2017 in related U.S. Appl. No. 14/883,843, 19 pp.
Notice of Allowance dated Mar. 21, 2017 in related U.S. Appl. No. 15/012,314, 8 pp.
Final Office Action dated Apr. 14, 2017 in related U.S. Appl. No. 14/883,836, 12 pp.
Final Office Action dated Apr. 20, 2017 in related U.S. Appl. No. 14/883,843, 8 pp.
Final Office Action dated May 3, 2017 in related U.S. Appl. No. 14/883,745, 11 pp.
Notice of Allowance dated Dec. 15, 2017 in related U.S. Appl. No. 14/883,745, 12 pages.
Notice of Allowance dated Dec. 15, 2017 in related U.S. Appl. No. 14/883,843, 14 pages.

\* cited by examiner

Sense open or closed switch

METHOD OF MANUFACTURING MEMS SWITCHES WITH REDUCED SWITCHING VOLTAGE

FIELD OF THE INVENTION

The invention relates to MEMS switches and methods of manufacturing MEMS switches and, more particularly, MEMS switches with reduced switching voltage and methods of manufacture.

BACKGROUND

Integrated circuit switches used in 3D and other integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs).

MEMS can be manufactured in a number of ways using a number of different tools. In general, though, the methodologies and tools are used to form small structures with dimensions in the micrometer scale. Also, many of the methodologies, i.e., technologies, employed to manufacture MEMS have been adopted from integrated circuit (IC) technology. For example, almost all MEMS are built on wafers and are realized in thin films of materials patterned by photolithographic processes. More specifically, the fabrication of MEMS use three basic building blocks: (i) deposition of thin films of material on a substrate, (ii) applying a patterned mask on top of the films by photolithographic imaging, and (iii) etching the films selectively to the mask.

Depending on the particular application and engineering criteria, MEMS structures can come in many different forms. For example, MEMS can be realized in the form of a single cantilever structure such as, for example, shown in U.S. Pat. No. 7,265,492. In this cantilever application, a single cantilever arm (suspended electrode) is pulled toward a fixed electrode by application of a voltage. In known applications, the voltage required to pull the suspended electrode down to the fixed electrode by electrostatic force may be high, which has been seen to cause unwanted charging on insulator after prolonged use and eventual failure of the switch. In certain applications, the high voltage, e.g., 100 volts, is also difficult to obtain since this has to be stepped up from about 1.5 volts to about 5 volts. The minimum voltage required is called pull-in voltage, which is dependent on area of the electrode, spacing or gap between the suspended and fixed electrodes, and spring constant of the membrane or springs.

Lowering the pull-in voltage without decreasing the gap and without softening the spring is desirable, as the spring provides the restoring force and determines the switching speed. In U.S. Pat. No. 7,265,492, a pair of side parallel-plate electrostatic actuators is implemented for lowering or eliminating of the bias voltages. These additional electrostatic actuators are used to reduce or eliminate the bias voltage to be applied on the fixed signal electrode. In implementation, the fixed electrode of the side parallel-plate electrostatic actuators can be elevated above a fixed signal electrode. Thus due to a smaller gap, the pull-in voltage required to pull the suspended electrode down to the fixed electrode can be lowered. However, the MEMS shown in U.S. Pat. No. 7,265,492 are not hermetically sealed, and the additional electrostatic actuators can increase fabrication costs.

Accordingly, there exists a need in the art to overcome the deficiencies and limitations described hereinabove.

SUMMARY

In a first aspect of the invention, a structure comprises at least two cantilevered electrodes having ends which overlap and which are structured and operable to contact one another upon an application of a voltage by at least one fixed electrode.

In a second aspect of the invention, a method of fabricating a switch comprises forming at least two cantilever electrodes and at least one fixed electrode through a series of resist deposition and patterning steps.

In yet another aspect of the invention, a method of forming a switch comprises: depositing layers of resist on a structure; patterning the resist to form sequential openings; sequentially depositing metal or metal alloy within the sequential openings until at least two cantilever electrodes and at least one voltage applying electrode are formed within the layers of resist; depositing a liner over an uppermost layer of the layers of resist; forming openings in the liner; etching the layers of the resist through the opening until the cantilever electrodes and the at least one voltage applying electrode are in a void; and sealing the void with additional liner material to form a hermetically sealed dome.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention, in which.

DETAILED DESCRIPTION

The invention relates to MEMS switches and methods of manufacturing MEMS switches and, more particularly, MEMS switches with reduced switching voltage and methods of manufacture. In implementation, the invention includes methods and structures of several novel MEMS switches optimized for (1) switching voltage (i.e. reducing it) and (2) reliability.

The MEMS switches of the invention include at least a double cantilever arrangement hermetically sealed within a nitride type liner, for example. In operation, a gap between the electrodes is reduced, compared to conventional MEMS switches. This arrangement will reduce the minimum switching voltage required to pull the electrodes together (i.e., reduced pull-in voltage) and/or the on time of the voltage. Accordingly, unwanted charging on insulator and failure of the switch can be reduced, compared to known conventional switches. Also, in operation, the MEMS switches substantially eliminate arcing, as well as large dielectric breakdown attributable to higher switching voltages. Although the MEMS switches are shown with a nitride hermetic seal, MEMS switches fabricated using the same methodology, either without nitride heremetic seals or with other methods of hermetic seals, such as a MEMS switch inside a cavity with a bonded chip or wafer cap, are contemplated by the present invention.

Exemplary Fabrication Processes in Accordance with the Invention

FIGS. 1a-1i show intermediate structures and respective fabrication processes in accordance with the invention. More specifically, the processes shown and described with reference to FIGS. 1a-1h are directed to the embodiment of FIG. 2. However, it should be recognized by those of skill in the art that with some modifications and/or additions to the processes described herein, e.g., patterning, metallization and/or deposition processes, the processes of FIGS. 1a-1i can be used to fabricate any of the embodiments described herein. Although such modifications and/or additions should become obvious to those of skill in the art after an explanation of each of the embodiments, some further explanation of the additional and/or modified processes are described herein as necessary for a more thorough understanding of the invention.

Figure 1A:
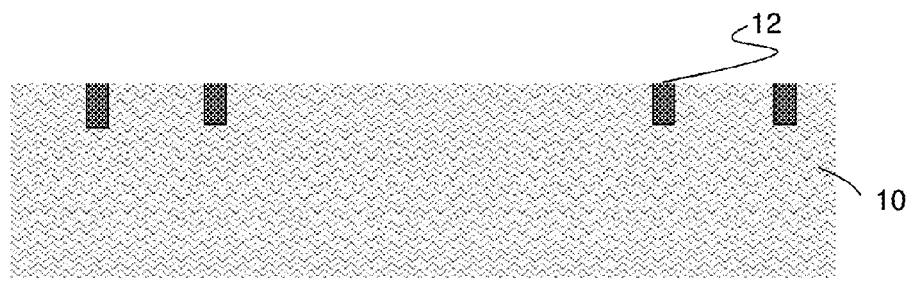
FIGS. 1a-1i show intermediate structures and respective fabrication processes in accordance with the invention.

More specifically, FIG. 1a shows a beginning structure in accordance with the invention. The beginning structure includes a dielectric material 10 with a plurality of vias 12. As should be understood by those of skill in the art, the dielectric material 10 may be an M+1 wiring layer in an integrated circuit. Although not shown in FIG. 1, it should be understood that the dielectric material 10 may be provided on a wafer of any known type used with the formation of integrated circuits. For example, the wafer can be silicon, BULK, SOI, SiGe; quartz; glass; or Gallium arsenide, to name a few. The vias 12 can be metallized using any combination of methods known in the art, such as physical vapor deposition (PVD), chemical vapor deposition (CVD), electroplated deposition (ECP), metal-organo chemical vapor deposition (MOCVD), etc. In one exemplary embodiment, the vias are tungsten plugs, with TiN liners. In another embodiment, the vias are formed using copper with TaN/Ta liners. In another embodiment, the vias are 'tapered vias' which are metallized with the conductor layer used to form 16a and 18a shown in FIG. 1b.

The plurality of vias 12 are formed using conventional lithographic processes. For example, a resist is deposited on the dielectric material 10 and selective portions of the resist are exposed to form openings. In subsequent processes, the dielectric material 10 is etched using a conventional process such as, for example, reactive ion etching (RIE) to form vias. The vias are filled with known metals or metal alloys to form the vias 12. The resist can be stripped away. The vias 12 can act as conductive pads as noted in more detail below.

Figure 1B:
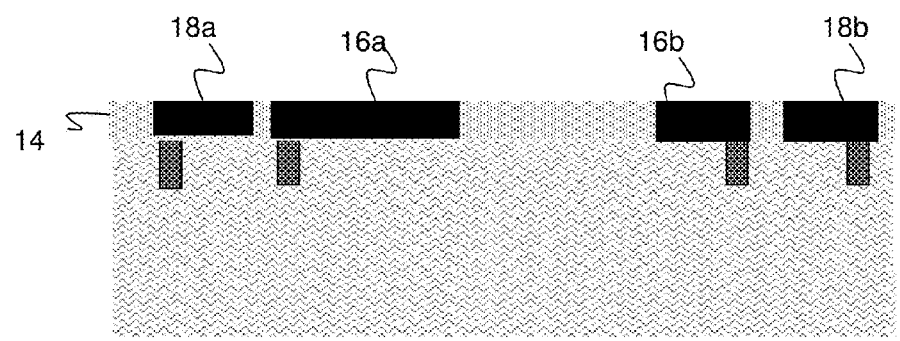
Figure 1C:
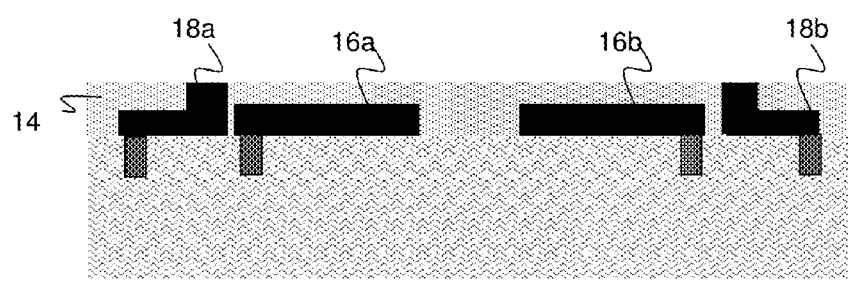
Figure 1D:
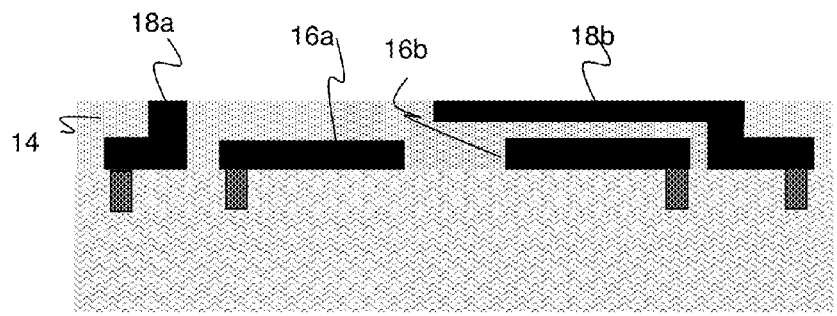
Figure 1E:
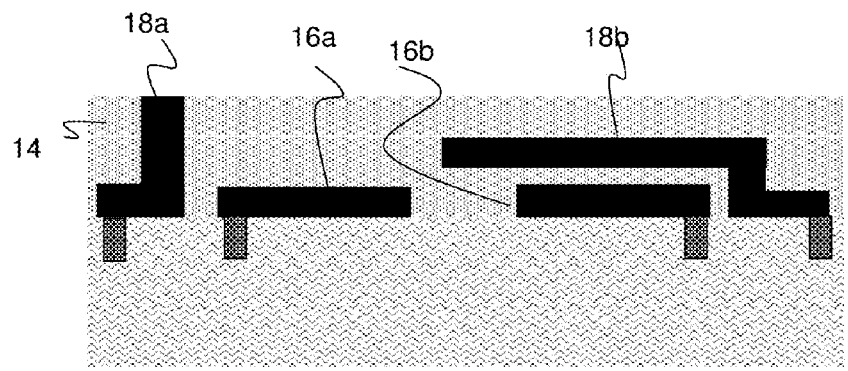

In FIG. 1b, the lower conductive MEMS switch electrodes are formed. These can be formed using any known method, such as by depositing the conductor, lithographically patterning it, etching it, and removing the photoresist used for lithographic patterning. Alternatively, other known methods, such as lift-off or damascene could be used. FIG. 1b shows a damascene method in which a sacrificial resist layer 14 is deposited over the structure of FIG. 1a. In one embodiment, the sacrificial resist layer 14 comprises Polymethylglutarimide (PMGI). PMGI is compatible with most g-line, i-line, and DUV photoresists and has excellent adhesion to Si, SiN, NiFe, Cu, Au, GaAs, and other III-V/III-VI materials. PMGI also exhibits a high thermal stability and can be applied in any conventional manner such as, for example, spin-coating. The PMGI can be stripped in NMP and DMSO-based removers. Also, PMGI is DUV, E-beam, and x-ray sensitivity, as well as exhibits a high etch rate in oxygen plasma.

In conventional processes, the sacrificial resist layer 14 is patterned to form openings. The openings are filled with a metal such as gold; although, other metals or metal alloys are also contemplated by the invention such as AlCu, W, or Cu. Prior to the deposition of the metal, one or more refractory metals, such as Ti, TiN, Ta, TaN, Ru, etc. can be used to line the vias. In the embodiment described herein, the metal will form fixed electrodes 16a and 16b and cantilevered electrodes 18a and 18b.

Figure 1F:
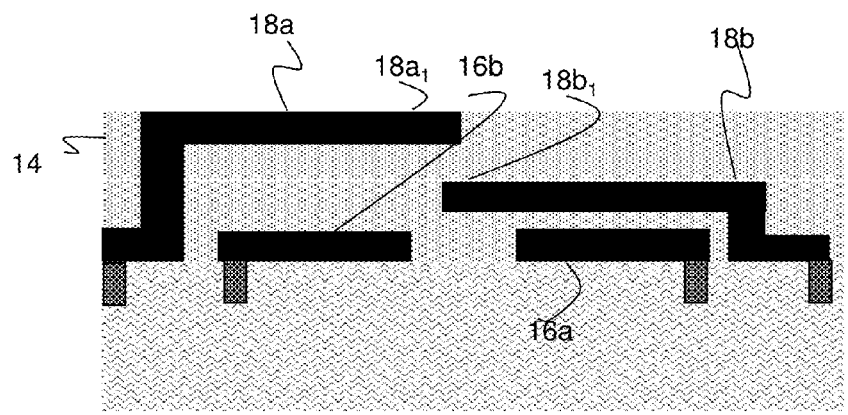

In processing steps shown in FIGS. 1c-1f, additional deposition and patterning processes are sequentially shown to build the fixed electrodes 16a and 16b and cantilevered electrodes 18a and 18b. The deposition and patterning processes are similar to that described with reference to FIG. 1b and, as such, additional explanation is not required for a complete understanding of the invention. In embodiments, the processes described herein result in the arm (beam) of the cantilever electrode 18b being formed in the processes shown in FIG. 1d and the arm of the cantilever electrode 18a being formed in the processes shown in FIG. 1f. Also, as shown in FIG. 1f, the electrodes 18a and 18b have respective end portions $18a_1$ and $18b_2$ that overlap. The overlapping end portions $18a_1$ and $18b_2$, upon application of a voltage, will close the switch, as discussed in greater detail below.

Figure 1G:
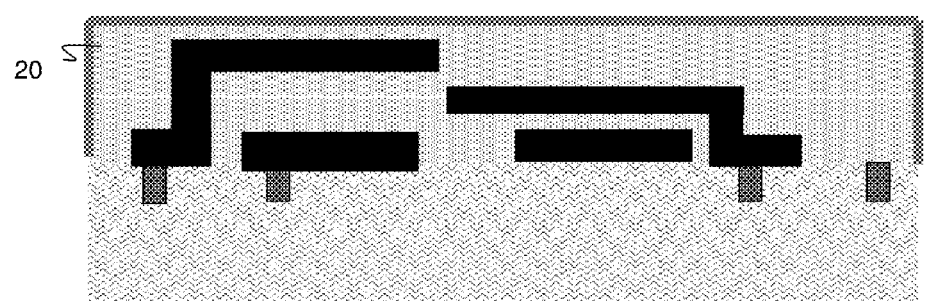
Figure 1H:
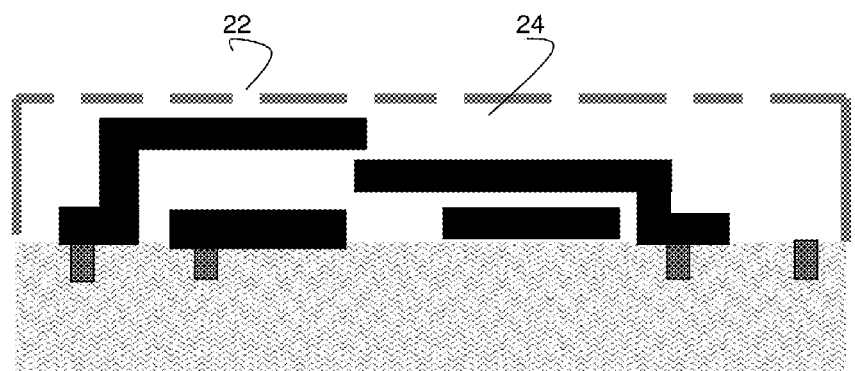
Figure 1I:
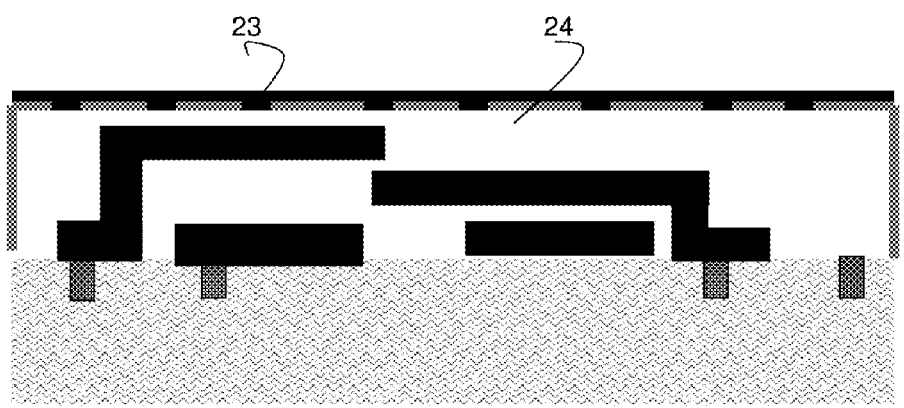

As shown in FIG. 1g, a hermetic dielectric, such as $Si_3N_4$ (nitride) liner 20 is deposited over the structure of FIG. 1h. In embodiments, the liner 20 can be SiN. In FIG. 1h, holes 22 are etched into the liner 20 to form openings, exposing the sacrificial resist. In subsequent processes, a wet etching using, for example, NMP (N-methylpyrrolidone) is used to dissolve the sacrificial resist encapsulated within the liner 20, creating a void 24. The void 24 is hermetically sealed by a deposition of Nitride 23 in order to close the holes 22 and form a hermetically sealed dome, as shown in FIG. 1i. As discussed above, the nitride dome is used to hermetically seal the MEMS switch and is optional. Although the method used for forming the freestanding cantilever beams uses the sacrificial PMGI resist, any known method of forming cantilever beams, such as using sacrificial α-silicon, subtractive-etch wiring, tapered via wiring, etc. could also be used.

First Aspect of the Invention

Figure 2:
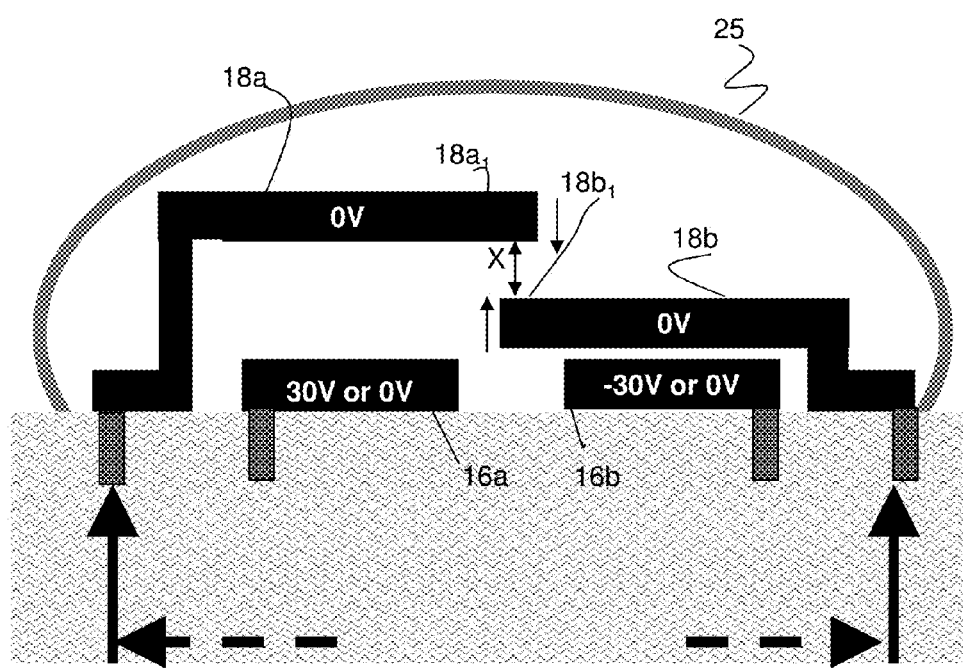
FIG. 2 shows a MEMS structure in accordance with a first aspect of the invention.
Figure 5:
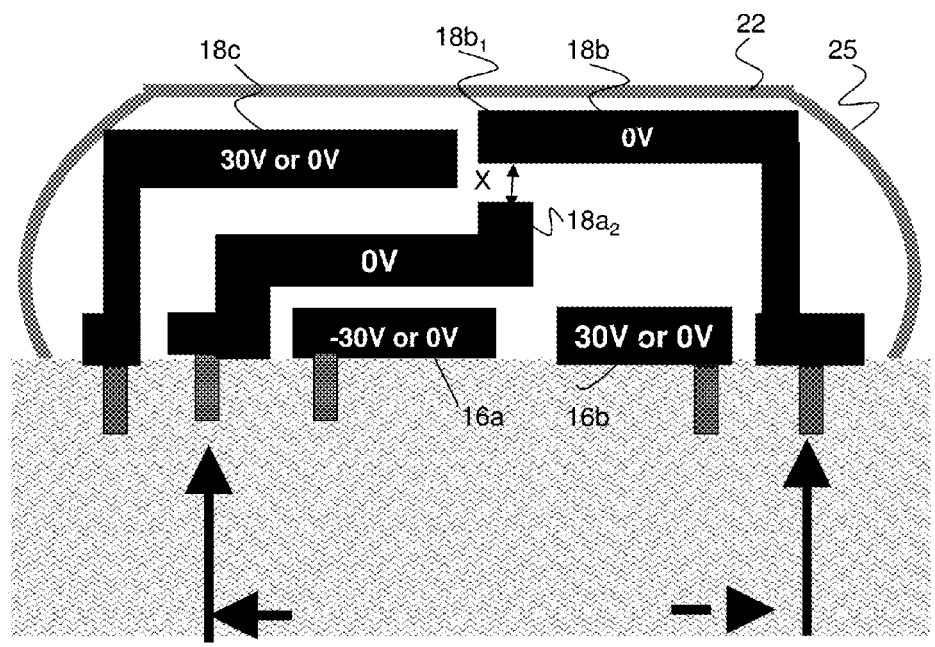
FIG. 5 shows a MEMS structure in accordance with a fourth aspect of the invention.

FIG. 2 shows a MEMS structure in accordance with a first aspect of the invention. In this aspect of the invention, the electrodes 16a and 16b and 18a and 18b are hermetically sealed within the nitride layer 25. The nitride dome 25 can be oval shaped, as shown in FIG. 2, rectangular shaped, as shown in FIG. 1, or any other known shape. In embodiments, the arms of the cantilever electrodes 18a and 18b are about 50 microns long, 9 microns high and 20 microns long; although other dimensions are also contemplated by the invention. Also, in further embodiments, a distance "X" between the respective overlapping end portions $18a_1$ and $18b_2$ is about two microns; although, other distances are also contemplated by the invention. To decrease the distance "X", vertically extending portions (as shown in the embodiment of FIG. 5) can extend from each of the cantilever electrodes 18a and 18b.

In operation, upon the application of a positive voltage to the fixed electrode 16a, the cantilever electrode 18a will be pulled down towards the cantilever electrode 18b. Also, upon a negative voltage applied to the fixed electrode 16b, the cantilever electrode 18b will be pushed up towards the cantilever electrode 18a. At a predetermined designed voltage, the respective overlapping end portions $18a_1$ and $18b_2$ will make contact with one another, i.e., travel the distance "X", thereby closing the switch. In the off state (0 voltage), the cantilever electrodes 18a and 18b will return to their original position, with a space "X" between the respective ends.

In one design, the voltage applied to the fixed electrode 16a is about 30 volts and the fixed electrode 16b is about −30 volts. This design voltage can be significantly lower than known conventional systems as the two cantilever arms are each designed and arranged to move a smaller distance than a single arm in a conventional system. More specifically, there can be a reduced switching voltage due to bending of both arms and the use of two voltage electrodes (e.g., 16a and 16b).

This reduced voltage is a minimum switching voltage required to pull the electrodes together (i.e., pull-in voltage). This reduced voltage can result in many advantages such as, for example, reduced on time voltage, unwanted charging on insulator and reduced failure of the switch (compared to known conventional switches). Also, in operation, the MEMS switch of FIG. 2 substantially eliminates arcing, as well as large dielectric breakdown attributable to higher switching voltages.

Second Aspect of the Invention

Figure 3:
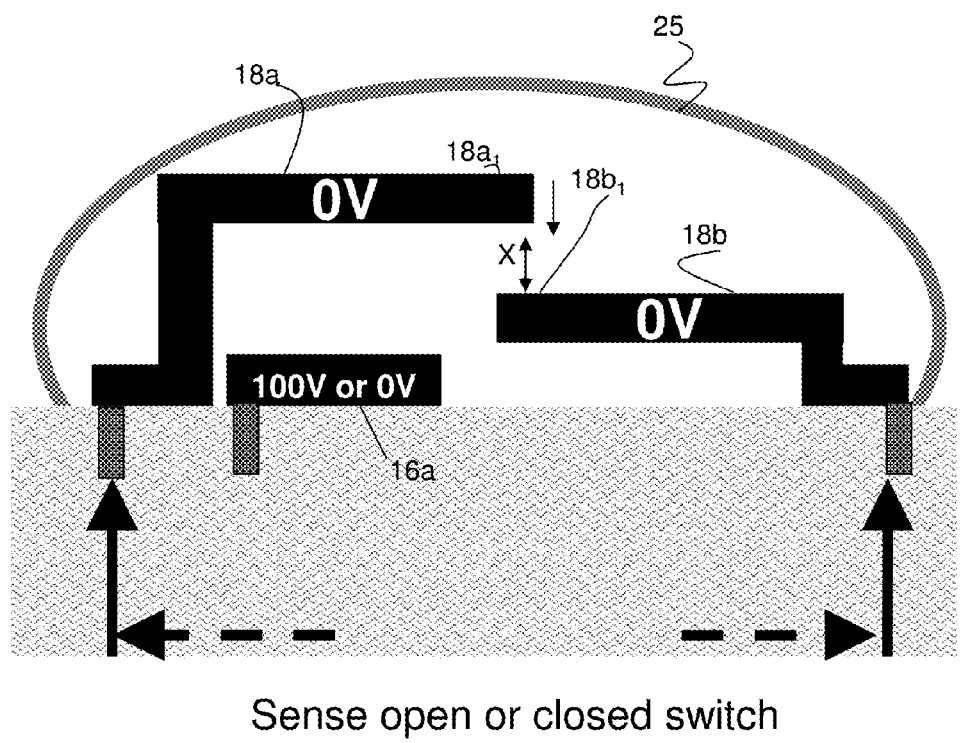
FIG. 3 shows a MEMS structure in accordance with a second aspect of the invention.

FIG. 3 shows a MEMS structure in accordance with a second aspect of the invention. In this aspect of the invention, the fixed electrode 16b has been eliminated. As in the other embodiments, the fixed electrode 16a and the cantilever electrodes 18a and 18b are hermetically sealed within the nitride layer 22. In embodiments, the arms of the cantilever electrodes 18a and 18b are about 50 microns long, 9 microns high and 20 microns long; although other dimensions are also contemplated by the invention. Also, in further embodiments, a distance "X" between the overlapping respective end portions $18a_1$ and $18b_1$ is about two microns; although, other distances are also contemplated by the invention. To decrease the distance "X", vertically extending portions (as shown in the embodiment of FIG. 5) can extend from one or both of the cantilever electrodes 18a and 18b.

In operation, upon the application of a positive voltage to the fixed electrode 16a, the cantilever electrode 18a will be pulled down towards the cantilever electrode 18b. At a predetermined designed voltage, the respective overlapping end portions $18a_1$ and $18b_1$ will make contact with one another, i.e., travel the distance "X", thereby closing the switch. In one design, the voltage applied to the fixed electrode 16a is about 100 volts. In the off state (0 voltage), the cantilever electrode 18a will return to its original position, with a space "X" between the respective end portions $18a_1$ and $18b_2$. In this embodiment, the cantilever electrode 18b is designed to remain stationary.

This arrangement also provides advantages such as, for example, reduced sticktion of the electrodes 18a and 18b. More specifically, as there are two cantilever arms 18a and 18b, it is theorized that that switch will stayed in the closed position, upon the application of a voltage, better than conventional MEMS switches. This will ensure that the switch will not fail.

Third Aspect of the Invention

Figure 4:
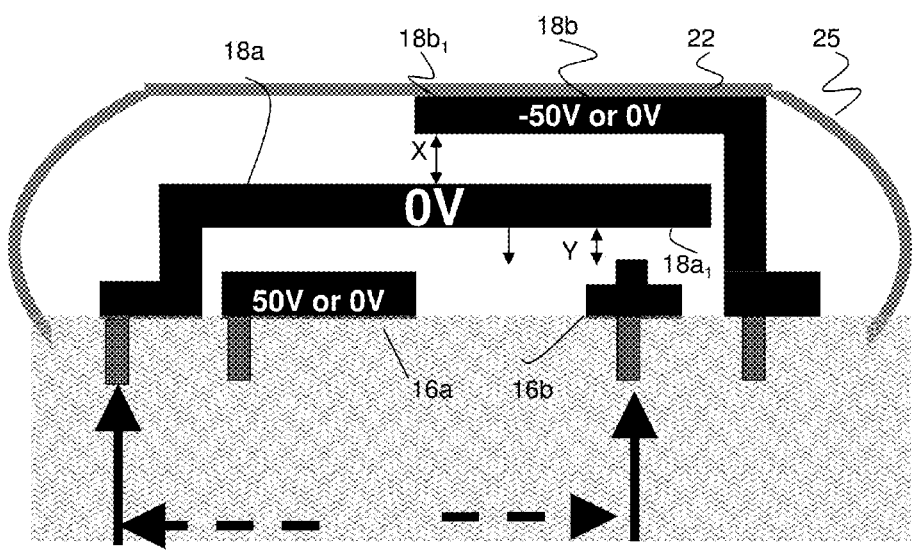
FIG. 4 shows a MEMS structure in accordance with a third aspect of the invention.

FIG. 4 shows a MEMS structure in accordance with a third aspect of the invention. In this aspect of the invention, the electrodes 16a and 16b and 18a and 18b are hermetically sealed within the nitride layer 22. In embodiments, the arms of the cantilever electrodes 18a and 18b have different lengths, such that 18b does not extent over 16a, where the arm of the cantilever electrode 18a is longer than the arm of the cantilever electrode 18b (although this can be reversed). To decrease the distance "X", vertically extending portions (as shown in the embodiment of FIG. 5) can extend from one or both of the cantilever electrodes 18a and 18b.

In embodiments, the arm of the cantilever electrode 18a extends over both of the fixed electrodes 16a and 16b. Also, in the embodiment of FIG. 4, the cantilever electrode 18b is fixed, i.e., embedded, to the nitride layer 22. This can be achieved by depositing the nitride layer 22 directly onto an upper surface of the cantilever electrode 18b. In an alternative embodiment, the cantilever electrode 18b can also be floating by adding an upper layer of sacrificial material (PMGI) prior to the deposition of the nitride layer 22. Also, in further embodiments, a distance "X" between the overlapping cantilevers 18a and 18b is about two microns; although, other distances are also contemplated by the invention. To decrease the distance "X", vertically extending portions (as shown in the embodiment of FIG. 5) can extend from the cantilever electrode 18a or the fixed electrode 16b.

In operation, upon the application of a positive voltage to the fixed electrode 16a, the cantilever electrode 18a will be pulled down towards the fixed electrode 16b. Also, upon a negative voltage applied to the cantilever electrode 18b, the cantilever electrode 18a will be pushed down towards the fixed electrode 16b. At a predetermined designed voltage, the end portion $18a_1$ will make contact with the fixed electrode 16b, i.e., travel the distance "Y", thereby closing the switch. In the off state (0 voltage), the cantilever electrode 18a will return to its original position, with a space "Y" between the cantilever electrode 18a and the fixed electrode 16b. In this design, the cantilever electrode 18b remains stationary, as it is fixed to the nitride liner 22.

In one design, the voltage applied to the fixed electrode 16a is about 50 volts and the voltage applied to the cantilever electrode 18b is about −50 volts. This design voltage can be significantly lower than known conventional systems as the arm of the cantilever electrode 18a is being pushed and pulled by the use of two voltage electrodes (e.g., 16a and 18b).

This reduced voltage is a minimum switching voltage required to pull the electrodes together (i.e., pull-in voltage). This reduced voltage can result in many advantages such as, for example, reduced on time voltage, unwanted charging on insulator and reduced failure of the switch (compared to known conventional switches). Also, in operation, the MEMS switch of FIG. 4 substantially eliminates arcing, as well as large dielectric breakdown attributable to higher switching voltages.

Fourth Aspect of the Invention

FIG. 5 shows a MEMS structure in accordance with a fourth aspect of the invention. In this aspect of the invention, an additional cantilever electrode 18c is formed using the processes described above, e.g., adding an additional deposition layer of resist and additional patterning steps. The electrodes 16a, 16b and 18a-18c are hermetically sealed within the nitride layer 22. In embodiments, the arm of the cantilever electrode 18a also includes a vertical extending protrusion (nub) $18a_2$. As in other embodiments, the cantilever electrodes 18a and 18b are about 50 microns long, 9 microns high and 20 microns long; although other dimensions are also contemplated by the invention. Also, in embodiments, a distance "X" between the respective portions $18a_2$ and $18b_1$ is about two microns; although, other distances are also contemplated by the invention. To decrease the distance "X", vertically extending portions can extend from each of the cantilever electrodes 18a and 18b.

In operation, upon the application of a positive voltage to the fixed electrode 16b, the cantilever electrode 18b will be pulled down towards the cantilever electrode 18a. Also, upon a negative voltage applied to the fixed electrode 16a and a positive voltage applied to the cantilever electrode 18c, the cantilever electrode 18a will be pushed upwards toward the cantilever electrode 18b. At a predetermined designed voltage, the respective nub portion $18a_2$ and the end portion $18b_1$ will make contact with one another, i.e., travel the distance "X", thereby closing the switch. In the off state (0 voltage), the cantilever electrodes 18a and 18b will return to their original position, with a space "X" between the respective ends.

In one design, the voltage applied to the fixed electrode 16b and the cantilever electrode 18c is about 30 volts. Also, the voltage applied to the fixed electrode 16a is about −30 volts. This design voltage can be significantly lower than known conventional systems as the two cantilever arms (18a and 18b) are each designed and arranged to move a smaller distance than a single arm in a conventional system. More specifically, there can be a reduced switching voltage due to bending of both arms and the use of three voltage electrodes (e.g., 16a, 16b and 18c).

This reduced voltage is a minimum switching voltage required to pull the electrodes together (i.e., pull-in voltage). This reduced voltage can result in many advantages such as, for example, reduced on time voltage, unwanted charging on insulator and reduced failure of the switch (compared to known conventional switches). Also, in operation, the MEMS switch of FIG. 5 substantially eliminates arcing, as well as large dielectric breakdown attributable to higher switching voltages.

Fifth Aspect of the Invention

Figure 6:
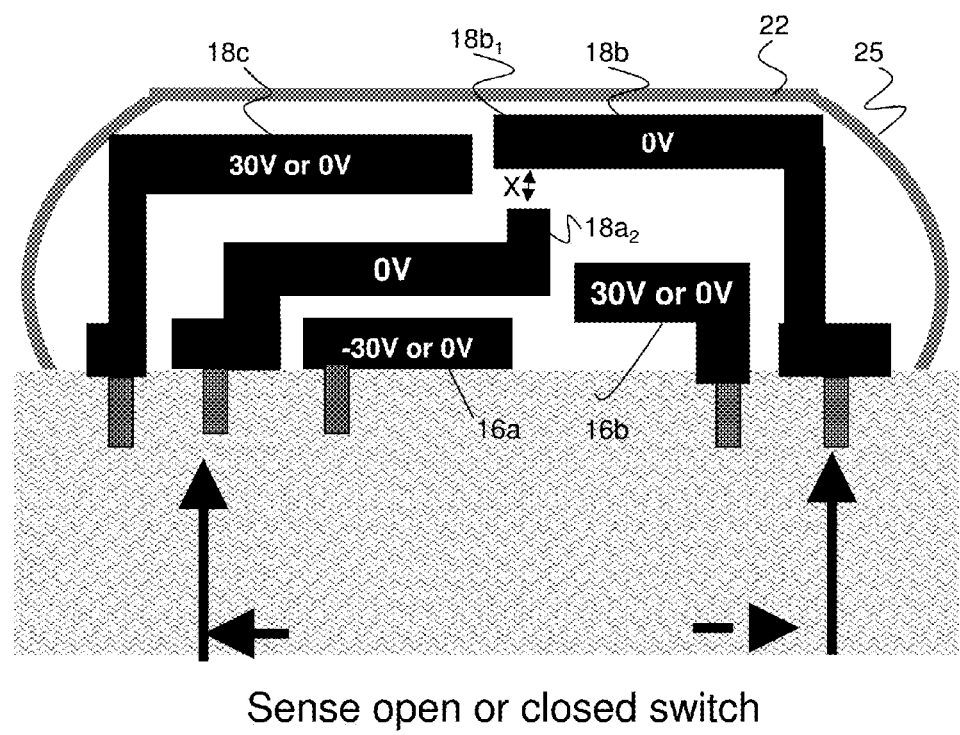
FIG. 6 shows a MEMS structure in accordance with a fifth aspect of the invention.

FIG. 6 shows a MEMS structure in accordance with a fifth aspect of the invention. In this aspect of the invention, an additional cantilever electrode 18c is formed using the processes described above, e.g., adding an additional deposition layer of resist and additional patterning steps. Also, the fixed electrode 16b can be raised to be closer to the cantilever electrode 18b which, in turn, provides an improved response time (as the space between the fixed electrode 16b and the cantilever electrode 18b is closed). The height of the fixed electrode 16b is higher than the height of the fixed electrode 16a. To decrease the distance "X", a vertically extending portion can also extend from the cantilever electrodes 18b. A gap is approximately 5 to 10 microns between the electrode 16b and the cantilever electrode 18b. In embodiments, the electrodes 16a, 16b and 18a-18c are hermetically sealed within the nitride layer 22.

In embodiments, the arm of the cantilever electrode 18a also includes a vertical extending protrusion (nub) $18a_2$. As in other embodiments, the cantilever electrodes 18a and 18b are about 50 microns long, 9 microns high and 20 microns long; although other dimensions are also contemplated by the invention. Also, in further embodiments, a distance "X" between the respective end portions $18a_1$ and $18b_2$ that overlap is about two microns; although, other distances are also contemplated by the invention.

In operation, upon the application of a positive voltage to the fixed electrode 16b, the cantilever electrode 18b will be pulled down towards the cantilever electrode 18a. Also, upon a negative voltage applied to the fixed electrode 16a and a positive voltage applied to the cantilever electrode 18c, the cantilever electrode 18a will be pushed upwards toward the cantilever electrode 18b. At a predetermined designed voltage, the respective nub portion $18a_2$ and the end portion $18b_1$ will make contact with one another, i.e., travel the distance "X", thereby closing the switch. In the off state (0 voltage), the cantilever electrodes 18a and 18b will return to their original position, with a space "X" between the respective ends.

In one design, the voltage applied to the fixed electrode 16b and the cantilever electrode 18c is about 30 volts. Also, the voltage applied to the fixed electrode 16a is about −30 volts. This design voltage can be significantly lower than known conventional systems as the two cantilever arms (18a and 18b) are each designed and arranged to move a smaller distance, than a single arm in a conventional system. More specifically, there can be a reduced switching voltage due to bending of both arms and the use of three voltage electrodes (e.g., 16a, 16b and 18c).

This reduced voltage is a minimum switching voltage required to pull the electrodes together (i.e., pull-in voltage). This reduced voltage can result in many advantages such as, for example, reduced on time voltage, unwanted charging on insulator and reduced failure of the switch (compared to known conventional switches). Also, in operation, the MEMS switch of FIG. 6 substantially eliminates arcing, as well as large dielectric breakdown attributable to higher switching voltages.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

It is claimed:

1. A method of fabricating a switch comprising:
   forming a fixed electrode;
   forming a first cantilevered electrode;
   forming a second cantilevered electrode aligned vertically over the fixed electrode, and which has an end that overlaps and is operable to directly contact an end of the first cantilevered electrode upon an application of a voltage to the fixed electrode; and forming a hermetically sealed volume encapsulating the fixed electrode, the first cantilevered electrode, and the second cantilevered electrode, wherein the first cantilevered electrode comprises an arm with an extending protrusion which extends upward from an upper surface of the arm.

2. The method of claim 1, wherein the hermetically sealed volume is a dome.

3. The method of claim 2, wherein the dome is oval shaped.

4. The method of claim 1, wherein overlapping portions of the first cantilevered electrode and the second cantilevered electrode are separated by a vertical distance of about two microns.

5. The method of claim 1, wherein the second cantilevered electrode is formed above the first cantilevered electrode.

6. The method of claim 1, wherein the hermetically sealed volume is formed with a nitride liner.

7. The method of claim 1, wherein the second cantilevered electrode is operable to directly contact the end of the first cantilevered electrode upon a positive voltage applied to the fixed electrode.

8. The method of claim 7, wherein the positive voltage is about 100 volts.

9. The method of claim 1, wherein the arm of the first cantilevered electrode is about 50 microns long.

10. A method of fabricating a switch comprising:
forming a fixed electrode;
forming a first cantilevered electrode;
forming a second cantilevered electrode aligned vertically over the fixed electrode, and which has an end that overlaps and is operable to directly contact an end of the first cantilevered electrode upon an application of a voltage to the fixed electrode; and
forming a hermetically sealed volume encapsulating the fixed electrode, the first cantilevered electrode, and the second cantilevered electrode,
wherein the forming the hermetically sealed volume comprises:
forming at least one hole in a nitride liner to gain access to a sacrificial resist;
etching the sacrificial resist; and
closing the at least one hole by deposition of additional liner material.

* * * * *